(12) United States Patent
Cheong

(10) Patent No.: US 6,712,903 B2
(45) Date of Patent: Mar. 30, 2004

(54) MASK FOR EVALUATING SELECTIVE EPITAXIAL GROWTH PROCESS

(75) Inventor: Woo Seock Cheong, Kyoungki-do (KR)

(73) Assignee: Hynix Semiconductor, Inc., Ich'on (KR)

(*) Notice: Subject to any disclaimer, the term of this patent is extended or adjusted under 35 U.S.C. 154(b) by 195 days.

(21) Appl. No.: 10/032,076

(22) Filed: Dec. 31, 2001

(65) Prior Publication Data
US 2002/0157485 A1 Oct. 31, 2002

(30) Foreign Application Priority Data
Apr. 30, 2001 (KR) .......................................... 2001-23401

(51) Int. Cl.$^7$ ........................ H01L 21/66; H01L 21/027; G01R 31/26
(52) U.S. Cl. ........................ 117/201; 29/705; 73/865.9; 216/12; 257/48; 324/765; 438/18; 438/945
(58) Field of Search ........................ 117/201; 29/705; 438/942, 945, 947, 18, 17, 14; 257/48; 73/432.1, 865.9, 866; 324/763, 765; 430/5; 216/12

(56) References Cited

U.S. PATENT DOCUMENTS

| | | | | |
|---|---|---|---|---|
| 3,095,340 A | * | 6/1963 | Triller | 216/16 |
| 5,252,414 A | * | 10/1993 | Yamashita et al. | 430/22 |
| 5,436,097 A | * | 7/1995 | Norishima et al. | 430/5 |
| 5,598,010 A | * | 1/1997 | Uematsu | 257/48 |
| 5,815,685 A | * | 9/1998 | Kamon | 716/21 |
| 5,871,658 A | * | 2/1999 | Tao et al. | 216/60 |
| 5,913,550 A | * | 6/1999 | Watanuki | 29/603.1 |
| 6,475,684 B2 | * | 11/2002 | Ki | 430/30 |
| 6,538,731 B2 | * | 3/2003 | Niu et al. | 356/237.5 |
| 2002/0045353 A1 | * | 4/2002 | Kang | 438/710 |
| 2002/0151092 A1 | * | 10/2002 | Li et al. | 438/16 |
| 2002/0176097 A1 | * | 11/2002 | Rodgers | 356/630 |
| 2003/0100134 A1 | * | 5/2003 | Kim et al. | 438/18 |

FOREIGN PATENT DOCUMENTS

| | | | | |
|---|---|---|---|---|
| EP | 395245 A2 | * | 10/1990 | H05K/13/08 |
| JP | 61-61421 | * | 3/1986 | 257/E21.214 |
| JP | 1-305519 | * | 12/1989 | 438/975 |
| JP | 4-324952 | * | 11/1992 | 324/765 X |
| JP | 5-63047 | * | 3/1993 | H01L/21/66 |
| JP | 7-297252 | * | 11/1995 | H01L/21/66 |
| WO | WO 80/00522 | * | 3/1980 | H01L/21/268 |

OTHER PUBLICATIONS

TDB—Acc—No. NN72091083 "Srlot Probing Pads" vol. 15, No. 4, pp. 1083–1084, Sep. 19, 1972.*
Sun et al., "A Comparative Study of n+/p Junction Formation for Deep Submicron Elevated Source/Drain Metal Oxide Semiconductor Field Effect Transistors", J. Electrochem. Soc., vol. 144, No. 10, Oct. 1997, pp. 3659–3664.
Noda et al., "A 0.1–$\mu$m Delta–Doped MOSFET Fabricated with Post–Low–Energy Implanting Selective Epitaxy", IEEE Transactions on Electron Devices, vol. 45, No. 4, Apr. 1998, pp. 809–814.

(List continued on next page.)

Primary Examiner—Thomas P. Noland
(74) Attorney, Agent, or Firm—Pillsbury Winthrop LLP

(57) ABSTRACT

Disclosed is a mask for evaluating selective epitaxial growth process. The disclosed mask comprises a mask pattern for resistance measurement to measure sheet resistance of grown single crystal silicon in a first area, a mask pattern for selectivity evaluation to evaluate selectivity of single crystal silicon growth in a second area diagonal to the first area, mask patterns for facet generation evaluation, having different shapes, to evaluate facet generation of grown single crystal silicon in a third area, mask patterns for loading effect evaluation, having different shapes, to evaluate growth of single crystal silicon by loading effect in the upper part of a fourth area and a mask pattern for uniformity evaluation to evaluate uniformity of grown single crystal silicon in the lower part of the pattern for loading effect evaluation in the fourth area.

45 Claims, 7 Drawing Sheets

OTHER PUBLICATIONS

Koga et al., "A $0.23\mu m^2$ Double Self-Aligned Contact Cell for Gigabit DRAMs With a Ge-Added Vertical Epitaxial Si Pad", IEDM 96, pp. 589–592, 1999 month not given.

Hada et al., "A Self-Aligned Contact Technology Using Anisotropical Selective Epitaxial Silicon For Giga-Bit DRAMs", IEDM 95, pp. 665–668, 1995 month not given.

Ohguro et al., "0.15– m Buried-Channel p-MOSFET's with Ultrathin Boron-Doped Epitaxial Si Layer", IEEE Transactions on Electron Devices, vol. 45, No. 3, Mar. 1998, pp. 717–721.

Mitani et al., "Buried Source and Brain (BSD) Structure for Ultra-shallow Junction Using Selective Deposition of Highly Doped Amorphous Silicon", Symposium on VLSI Technology Digest of Technical Papers, 1996, pp. 176–177, month not given.

Tanaka et al., "Channel Engineering Using B10H14 Ion Implantation for Low Vth and High SCE Immunity of Buried-Channel PMOSFETs in 4–Gbit DRAMs and Beyond", IEEE, 1998, pp. 2–3, month not given.

Yamakawa et al., "Drivability Improvement on Deep-Submicron MOSFET's by Elevation of Source/Drain Regions", IEEE Electron Device Letters, vol. 20, No. 7, Jul. 1999, pp. 366–368.

Chao et al., "Low Resistance Ti or Co Salicided *Raised Source/Drain* Transistors for Sub–0.13 $\mu$m CMOS Technologies", IEDM 97, pp. 103–106, month not given.

Mazuré et al., "Facet Engineered Elevated Source/Drain by Selective Si Epitaxy for 0.35 Micron MOSFETS", IEDM, 1992, pp. 853–856, month not given.

Miyano et al., "Facet-Free Si Selective Epitaxial Growth Adaptable to Elevated Source/Drain MOSFETs with Narrow STI", Extended Abstracts of the 1998 International Conference on Solid State Devices and Materials Hiroshima, 1998, pp. 420–421, month not given.

Lee et al., "High Performance Buried Channel–pFETs Using Elevated Source/Drain Structure with Self–Aligned Epitaxial Silicon Silver (SESS)", Extended Abstracts of the 1999 International Conference on Solid State Devices and Materials, Tokyo, 1999, pp. 38–39, month not given.

Sun et al., "Impact of Epi Facets on Deep Submicron Elevated Source/Drain MOSFET Characteristics", IEEE Transactions on Electron Devices, vol. 45, No. 6, Jun. 1998, pp. 1377–1380.

Sayama et al., "Low Resistance Co–Salicided 0.1 $\mu$m CMOS Technology Using Selective Si Growth", 4–930813–94–8/99, Aug. 1999 presumed.

Lee et al., "Strained Growth Behavior of Selective Silicon Epitaxy in Confined Structures", Journal of the Korean Physical Society, vol. 33, No. 1998, pp. S302–S304.

Asenov et al., "Suppression of Random Dopant–Induced Threshold Voltage Fluctuations in Sub–0.1–um MOSFET's with Epitaxial and δ–Doped Channels", IEEE Transactions on Electron Devices, vol. 46, No. 8, Aug. 1999, pp. 1718–1721 and 1723–1724.

Sun et al., "The Effect of the Elevated Source/Drain Doping Profile on Performance and Reliability of Deep Submicron MOSFET's", IEEE Transcations on Electron Devices, vol. 44, No. 9, Sep. 1997, pp. 1491–1498.

Koga et al., "Two–Dimensional Borderless Contact Pad Technology for a 0.135 $\mu m^2$ 4–Gigabit DRAM Cell", IEDM 97, pp. 25–28, 1997 month not given.

Ohguro et al., "Undoped Epitaxial Si Channel n–MOSFET Grown by UHV–CVD with Preheating", IEEE Transactions on Electron Devices, vol. 45, No. 3, Mar. 1998, pp. 710–716.

\* cited by examiner

100μm

100μm

1600μm

MASK FOR EVALUATING SELECTIVE EPITAXIAL GROWTH PROCESS

BACKGROUND OF THE INVENTION

1. Field of the Invention

The present invention relates to a method for fabricating a semiconductor device and, more particularly, to a mask for evaluating a selective epitaxial growth process.

2. Description of the Related Art

Semiconductor devices have become more highly-integrated and have higher performance capabilities and accordingly, new methods have been developed to improve device properties. A selective epitaxial growth ("SEG") process is one of the methods.

The SEG process has been applied to shallow junction formation and the isolation process in memory devices and recently, it has been applied to contact plug formation. And, it is expected that the SEG process will be widely used for simplifying processes and for improving of electric properties.

As is generally known, in the SEG process, single crystal silicon is selectively grown on the exposed silicon region of the semiconductor and is not grown on insulating layers such as oxide layers and nitride layers. As a result, the SEG process is completely different from a general CVD process and therefore, development of the SEG process is also different from that of CVD process.

That is, according to the SEG process, single crystal silicon is grown by supplying silicon growth sources to an exposed silicon region using activation of a gas phase reaction. Therefore, single crystal silicon growth differs according to the exposed silicon region. The exposed silicon region effects the growth speed, facet, selectivity and uniformity in the single crystal silicon.

Therefore, in order to develop the SEG process, the above items need to be evaluated. In a conventional method, test patterns corresponding to the items are formed and then evaluation thereof is performed.

However, there is difficulty in technological development of the conventional SEG process since it evaluates specific test patterns. That is, different test patterns are required for each development item, therefore, significant time and cost is required to get data on each test pattern.

Moreover, due to a lack of test items, there is a limitation in understanding the mechanism of single crystal silicon growth with the conventional SEG process.

SUMMARY OF THE INVENTION

Therefore, an object of the present invention is to provide a mask for evaluating the SEG process, possessing most suitable patterns therein.

Another object of the present invention is to provide a mask for evaluating the SEG process capable of reducing time and cost for SEG technological development.

And, still another object of the present invention is to provide a mask for evaluating the SEG process capable of being advantageously applied to development of SEG process equipment.

In order to achieve the above objects, in the present invention, a mask for evaluating the selective epitaxial growth process to evaluate the growth mode of single crystal silicon grown with the selective epitaxial growth process according to an exposed silicon region comprises a mask pattern with four distinct areas. First there is a mask pattern for measuring the sheet resistance of grown single crystal silicon in a first area. The second is a mask pattern for selectivity evaluation to evaluate selectivity of single crystal silicon growth in a second area diagonal to the first area. Third, there is a mask pattern for facet generation evaluation to evaluate facet generation of grown single crystal silicon, having different shapes in a third area. Next, is a mask pattern for loading effect evaluation to evaluate a growth mode of single crystal silicon by loading effect in the upper part of a fourth area Lastly, is a mask pattern for uniformity evaluation to evaluate uniformity of grown single crystal silicon in the lower part of the fourth area.

The above objects, and other features and advantages of the present invention will become more apparent after reading the following detailed description when taken in conjunction with the drawings.

DETAILED DESCRIPTION OF THE INVENTION

Figure 1:
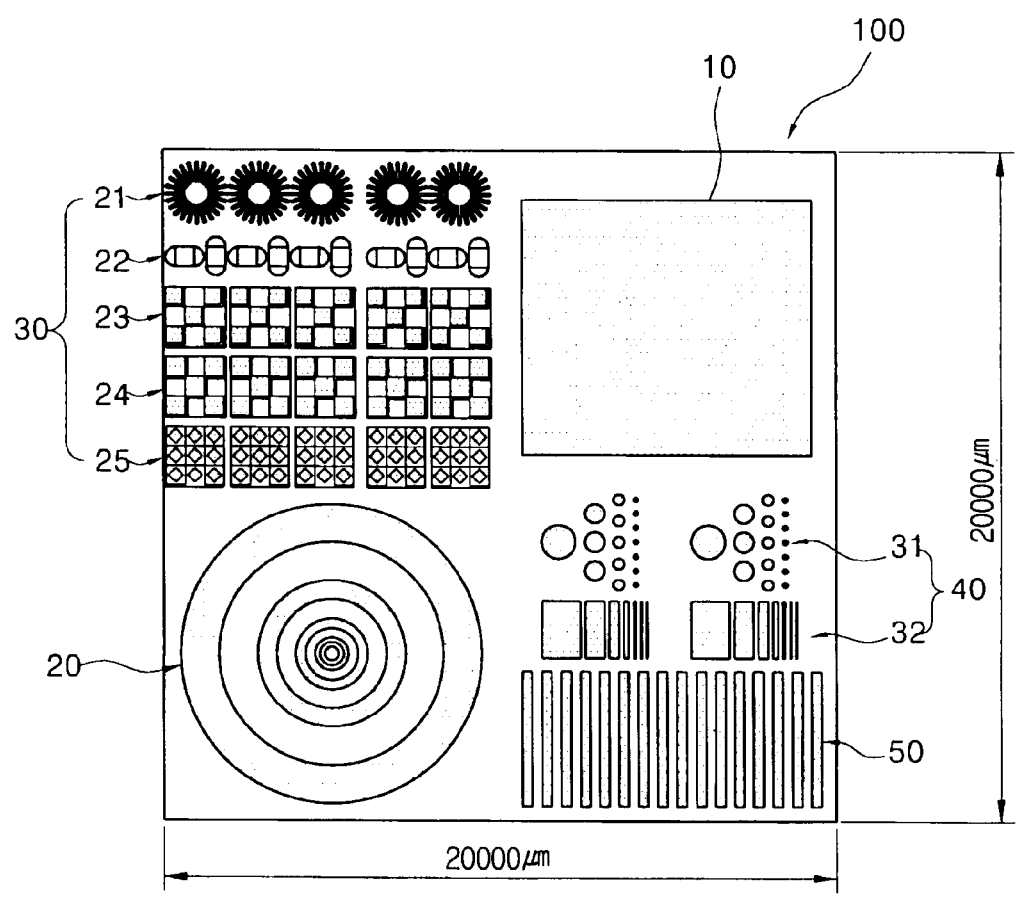
FIG. 1 is a drawing showing a mask for evaluating the selective epitaxial growth process according to an embodiment of the present invention.

FIG. 1 shows a mask for evaluating the SEG process according to an embodiment of the present invention. A mask 100 for evaluating the SEG process of the present invention is an exposure mask for patterning an insulating layer formed on a wafer into a predetermined form. And, it is used to evaluate a growth mode of single crystal silicon grown with the SEG process. In the mask 100, mask patterns 10, 20, 30, 40, 50 are parts that will be etched in a test wafer.

The mask 100 of the present invention is in a regular square form where one side is approximately 1.5 to 3 $\mu$m long, desirably 2 $\mu$m. The inner part is divided into 5 areas that have items for evaluating technological development of the SEG process in each area. For example, mask patterns for resistance measurement 10, selectivity evaluation 20, facet generation evaluation 30, loading effect evaluation 40 and uniformity evaluation 50.

Figure 2:
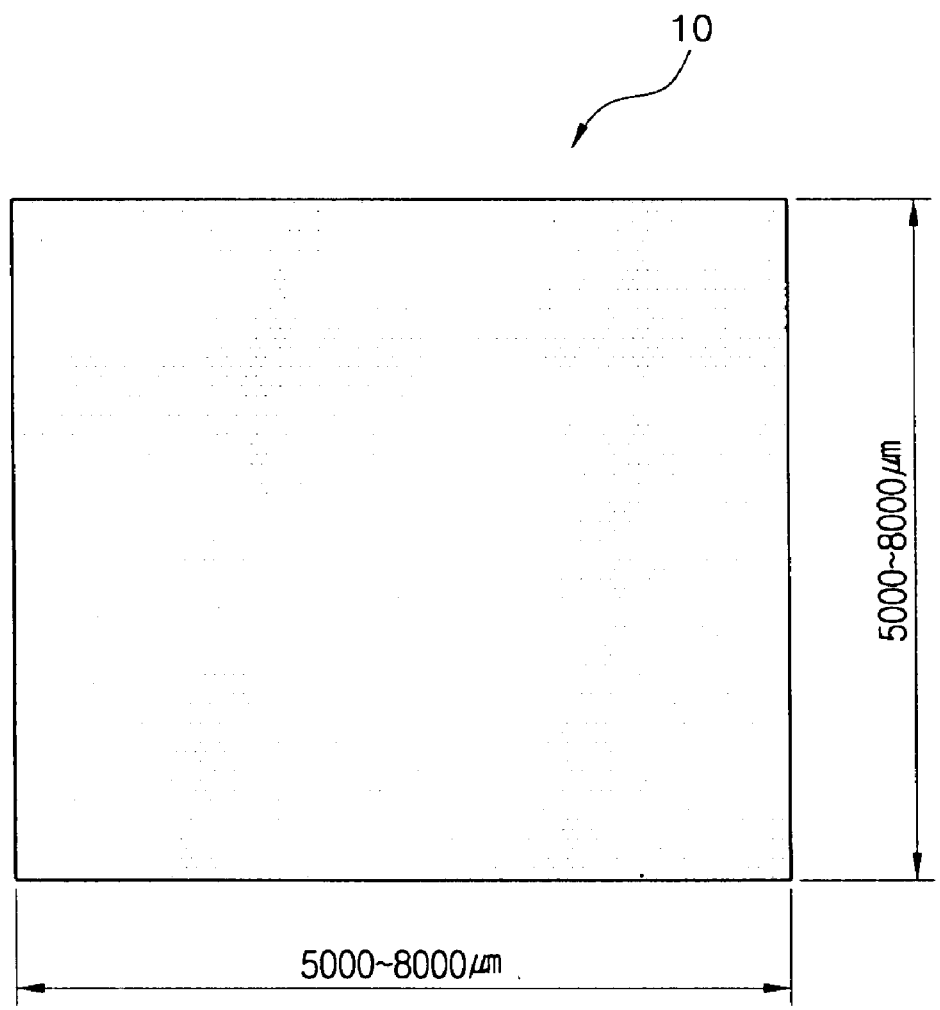
FIG. 2 is a drawing showing a mask pattern for resistance measurement in the mask for evaluating the selective epitaxial growth process of the present invention.

The mask pattern 10 for resistance measurement is disposed on one side, the upper right, of the four-divided sides of mask 100 in a regular square block. Referring to FIG. 2, the mask pattern 10 for resistance measurement is in a regular square form wherein one side is approximately 5,000 to 8,000 $\mu$m and a distance between the mask pattern 10 and an adjacent active region, and etched region is approximately 10 to 26 $\mu$m.

Figure 3:
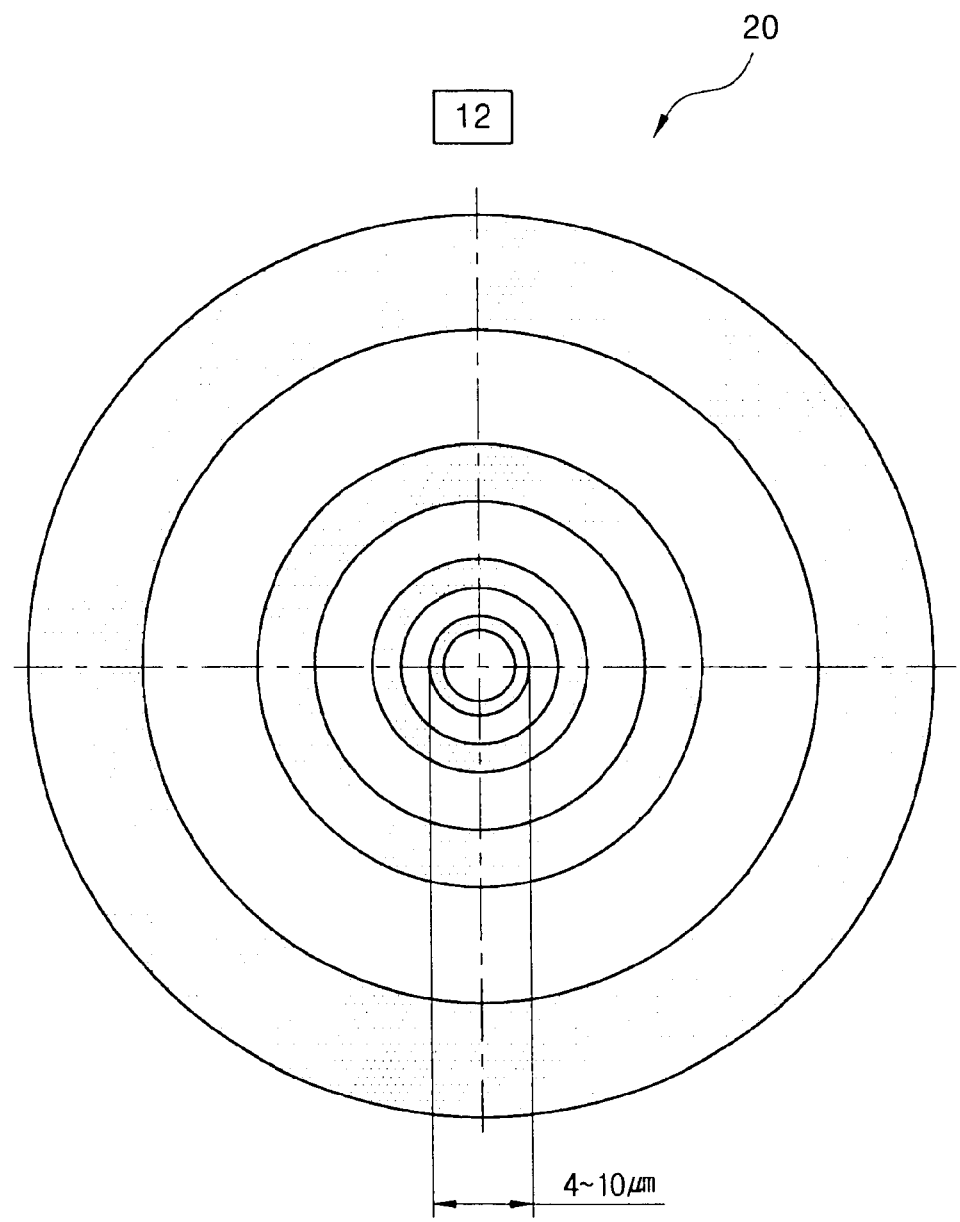
FIG. 3 is a drawing showing a mask pattern for selectivity evaluation in the mask for evaluating the selective epitaxial growth process of the present invention.

The mask pattern 20 for selectivity evaluation is disposed on a part diagonal to the mask pattern 10 for resistance measurement, that is, on the lower left of the mask 100 and comprises a plurality of circular bands having different inside diameters. Referring to FIG. 3, the mask pattern 20 comprises a plurality of circular bands wherein the circular band the outside has a larger inside diameter than the circular band on the inside and the width of the band corresponds to the distance between the circular bands just inside it. And, the inside diameters of circular bands are doubled as one proceeds outward from the innermost circular band. That is, the first circular band has an inside diameter of approximately 4 to 10 $\mu$m and the outmost circular band has an inside diameter of approximately 10,000 $\mu$m. And, the circular bands have consecutive numbers such as the number "12" shown in FIG. 3 on the upper parts thereof.

The mask pattern 30 for facet generation evaluation is disposed on one side, the upper left, of the mask 100, and comprises first through fifth mask patterns 21, 22, 23, 24, 25 having different forms and being arranged in regular sequence toward the lower part of the mask.

Figure 4A:
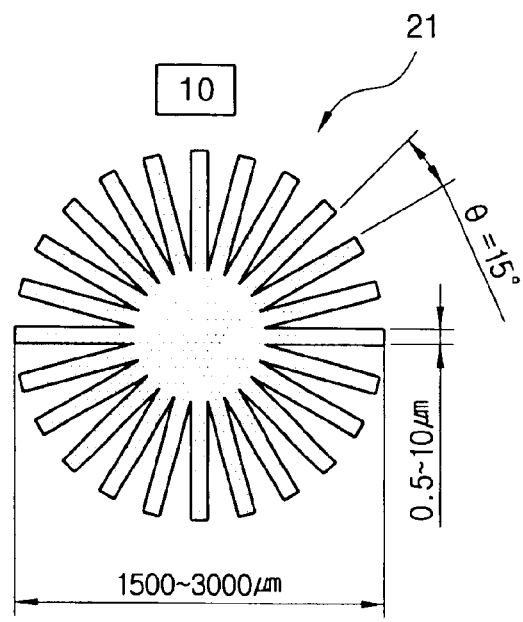
FIGS. 4A to 4E are drawings showing mask patterns for facet generation evaluation in the mask for evaluating the selective epitaxial growth process of the present invention.

As shown in FIG. 4A, the first mask pattern 21 for facet generation evaluation comprises a plurality of bar patterns having the same width and length and rotated at a predetermined angle. The bar pattern has a width of approximately 0.5 to 10 $\mu$m, and a length of approximately 1,500 to 3,000 $\mu$m, desirably, 1,600 $\mu$m. The angle of rotation between the bar patterns is preferably maintained at 15°. According to an embodiment of the present invention, the first mask pattern 21 comprises 5 bar patterns of approximately 10 $\mu$m, 5 $\mu$m, 2 $\mu$m, 1 $\mu$m and 0.5 $\mu$m and the size of bar patterns are input on the upper part of each first mask pattern 21.

Figure 4B:
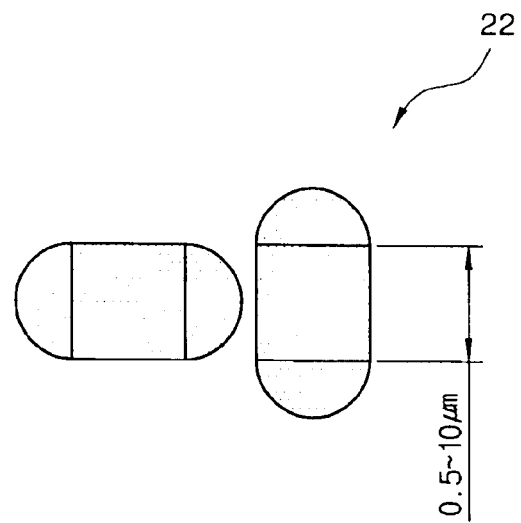

The second mask pattern 22 for facet generation evaluation is disposed on the lower part of the first mask pattern 21 and, as shown in FIG. 4B, has a pattern comprising a square and two semicircles on opposite sides thereof (hereinafter, referred to as square-semicircular pattern). Two square-semicircular patterns perpendicular to each other are formed in a pair and the mask 100 comprises a plurality of pairs, for example, 5 pairs. In the square-semicircle pattern, a side of the square is approximately 0.5 to 10 $\mu$m long and the long side of the square-semicircular pattern is double the length of the short side thereof. According to an embodiment of the present invention, the mask 100 comprises 5 kinds of second mask pattern 22. One side of each pattern is approximately 10 $\mu$m, 5 $\mu$m, 2 $\mu$m, 1 $\mu$m, and 0.5 $\mu$m long.

Figure 4C:
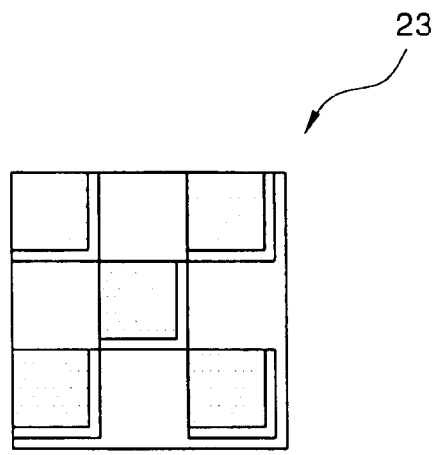

The third mask pattern 23 for facet generation evaluation is disposed on the lower part of the second mask pattern 22 and, as shown in FIG. 4C, has a pattern in which inner square patterns are surrounded by outer square patterns (hereinafter, referred to as a positive block pattern). The inner square pattern is actually etched and the outer pattern is not etched. One side of the inner square pattern is desirably 80 $\mu$m long. According to an embodiment of the present invention, the mask 100 comprises 5 kinds of the third mask pattern 23 and a side of each inner square pattern is approximately 8 $\mu$m, 4 $\mu$m, 1.6 $\mu$m, 0.8 $\mu$m and 0.4 $\mu$m long and a side of each outer square pattern is approximately 10 $\mu$m, 5 $\mu$m, 2 $\mu$m, 1 $\mu$m and 0.5 $\mu$m long.

Figure 4D:
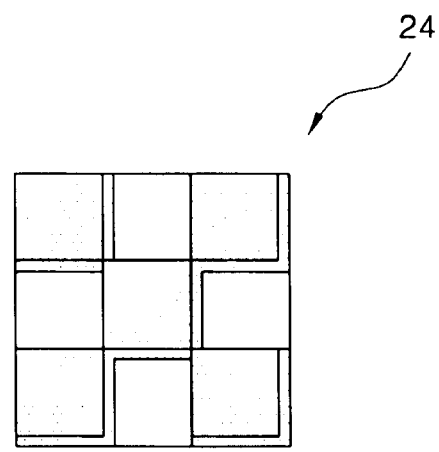

The fourth mask pattern 24 for facet generation evaluation is disposed on the lower part of the third mask pattern 23 and, as shown in FIG. 4D, has a pattern in which outer square patterns surround inner square patterns (hereinafter, referred to as a negative block pattern). Contrary to the third mask pattern 23, the outer square pattern is actually etched and the inner square pattern is not etched. One side of the outer square pattern is desirably 120 $\mu$m long. According to an embodiment of the present invention, the mask 100 comprises 5 kinds of the fourth mask pattern and one side of each inner square pattern is approximately 10 $\mu$m, 5 $\mu$m, 2 $\mu$m, 1 $\mu$m and 0.5 $\mu$m long and one side of each outer square pattern is approximately 12 $\mu$m, 6 $\mu$m, 2.4 $\mu$m, 1.2 $\mu$m and 0.6 $\mu$m long.

Figure 4E:
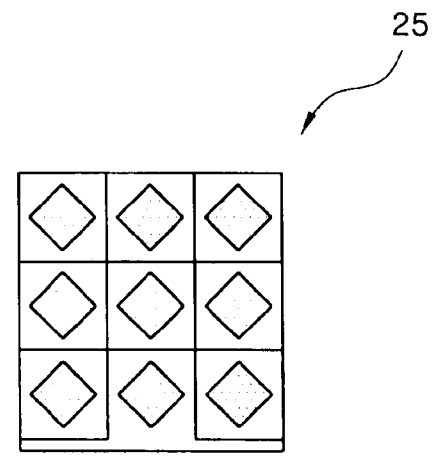

The fifth mask pattern 25 for facet generation evaluation is disposed on the lower part of the fourth mask pattern 24 and as shown in FIG. 4E, has a pattern in which a diamond is disposed in a square (hereinafter, referred to as a diamond pattern). One side of the diamond pattern is desirably 80 $\mu$m long. According to an embodiment of the present invention, one side of square pattern is approximately 0.5 to 10 $\mu$m long. Also, the mask 100 comprises 5 kinds of the fifth mask pattern and one side of each square pattern is approximately 8 $\mu$m, 4 $\mu$m, 1.6 $\mu$m, 0.8 $\mu$m and 0.4 $\mu$m long.

Figure 5A:
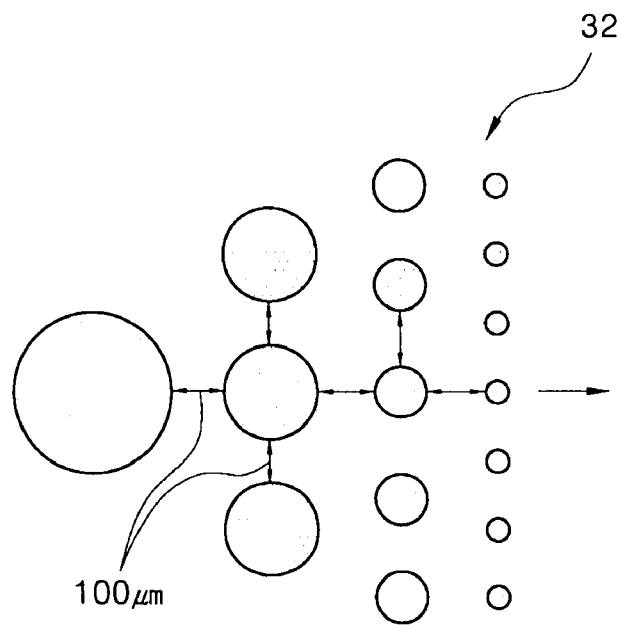
FIGS. 5A and 5B are drawings showing mask patterns for loading effect evaluation in the mask for evaluating the selective epitaxial growth process of the present invention.
Figure 5B:
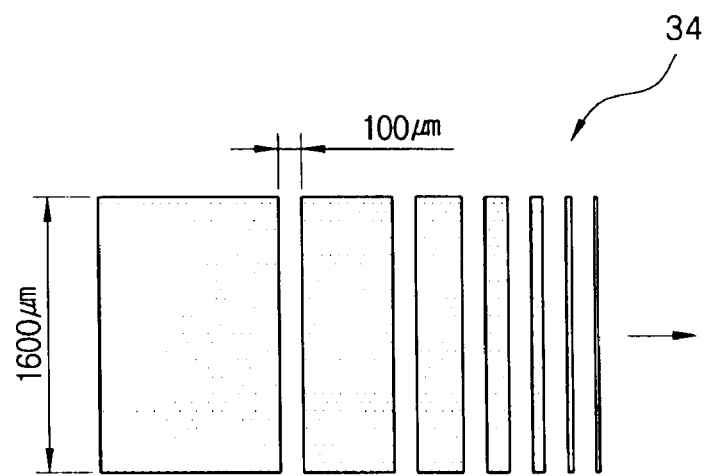

The mask pattern 40 for loading effect evaluation is disposed on the lower right of the mask pattern 10 for resistance measurement and, as shown in FIGS. 5A and 5B, has a first mask pattern 32 comprising a plurality of circle patterns and a second mask pattern 34 comprising a plurality of bar patterns.

Referring to FIG. 5A, the first mask pattern 32 for loading effect evaluation comprises a plurality of circle patterns arranged with the same distance between them and having smaller diameters in one direction. The diameter of the circle patterns is doubled from approximately 0.25 $\mu$m to 1,500 $\mu$m, and the circle patterns are arranged within a regular distance. According to an embodiment of the present invention, the mask 100 has circle patterns having diameters of approximately 16 $\mu$m, 8 $\mu$m, 4 $\mu$m, 2 $\mu$m, 1 $\mu$m, 0.5 $\mu$m and 0.25 $\mu$m and the distance between circle patterns is approximately 50 to 150 $\mu$m, desirably, 100 $\mu$m. And, the mask 100 has at least 2 groups of the circle patterns.

Referring to FIG. 5B, the second mask pattern 34 for loading effect evaluation comprises a plurality of bar patterns arranged with the same distance between them and having smaller widths in one direction. Here, the bar pattern has a length of approximately 1,000 to 2,000 $\mu$m, desirably, 1,600 $\mu$m. And, the width of the bar patterns is doubled from approximately 0.25 $\mu$m to 1,500 $\mu$m and the bar patterns are arranged within a regular distance. According to an embodiment of the present invention, the mask 100 has bar patterns having widths of approximately 16 $\mu$m, 8 $\mu$m, 4 $\mu$m, 2 $\mu$m, 1 $\mu$m, 0.5 $\mu$m and 0.25 $\mu$m and the distance between bar patterns is approximately 50 to 150 $\mu$m, desirably, 100 $\mu$m. And, the mask 100 has at least 2 groups of the bar patterns.

Figure 6:
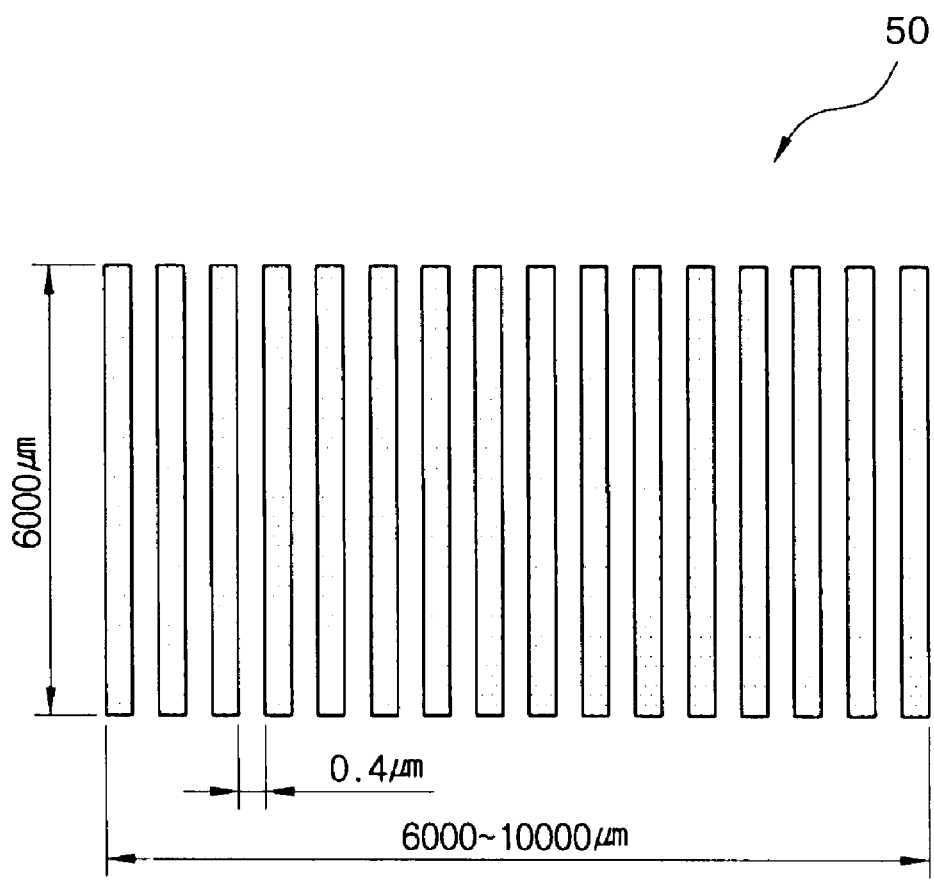
FIG. 6 is a drawing showing a mask pattern for uniformity evaluation in the mask for evaluating the selective epitaxial growth process of the present invention.

Finally, the mask pattern 50 for uniformity evaluation is disposed on the lower part of the mask pattern 40 for loading effect evaluation and as shown in FIG. 6, comprises bar patterns having the same length and width. Here, the bar pattern has a width of about 0.2 to 0.5 $\mu$m, desirably, 0.4 $\mu$m and a length of about 4,000 to 8,000 $\mu$m, desirably, 6,000 $\mu$m and the distance between the bar patterns is maintained at about 0.2 to 0.5 $\mu$m, desirably, 0.4 $\mu$m. The whole width of the mask pattern 50 for uniformity evaluation is approximately 6,000 to 10,000 $\mu$m.

As described above, mask patterns of the mask for evaluating the SEG process are advantageously applied as follows.

First, sheet resistance of the silicon layer grown by the in-situ doping SEG process typically has been measured on a film grown on a bare wafer. It is possible to observe the change of the sheet resistance according to the doping concentration and thickness by using the bare wafer.

However, it is difficult to accurately measure the thickness of the layer. Accordingly, it is also difficult to measure the influence of uniformity on resistance value. However, the mask pattern 10 for resistance measurement of the present invention has a block shape of predetermined area, therefore it is possible to accurately measure the thickness and sheet resistance.

The SEG process is a process that is largely dependent on the pattern, therefore, it is essential to measure selectivity of the SEG process according to patterns in technological development of the SEG process. Generally, growth speed is inversely proportional to selectivity. And, because the SEG process is affected by loading effect, the selectivity largely depends on patterns.

That is, in the SEG mechanism, as the amount of fill-up of silicon source for growth is increased on an insulating layer, the selectivity is decreased. Generally, the fill-up condition depends on macro-loading distance. Therefore, if the spacing distance is changed in a pattern, silicon generates nucleuses in pattern width not affected by macro-loading effect, thereby losing the selectivity. Therefore, in order to accurately measure the macro-loading distance, the maintenance of the active region of 50 $\mu$m is required. If the active region is not maintained, overflowing of silicon source is caused and therefore, the macro-loading distance is not accurately measured. The mask pattern 20 for selectivity evaluation of the present invention comprises a plurality of circular bands and they become gradually larger. Moreover, the widths of circular bands are doubled in proportion to the diameter, therefore, it is advantageously applied to selectivity evaluation.

The facet generation evaluation is also essential in the SEG process. The facet indicates a corner distortion generated during the growth of silicon. The facet pattern is closely connected with the process condition. That is, single crystal silicon grown by the SEG process has a different growth speed. Also, stress and interfacial energy is different according to the growth direction and insulating layer. Therefore, there is a great possibility of facet generation. According to the present invention, the mask pattern for facet generation evaluation comprises patterns of diverse form and size such as bar rotation, square-semicircular, positive block, negative block and diamond. As a result, it is possible to analyze generation of diverse facet types.

For example, a facet may not be generated during growth of SEG using LPCVD, however, if the angle is changed, the result is also changed. In this case, the facet is evaluated by the rotating bars shown in FIG. 4A. And, facet generation by growth can be analyzed by reducing the width of bar patterns.

In another example, facet generation in a straight line is different from that in a curved line. In this case, the facet generation in straight and curved lines is analyzed and suppressed by the square-semicircular second mask pattern 22 shown in FIG. 4B.

In still another example, as shown in FIG. 4C, the third mask pattern 23 for facet generation evaluation has a pattern in which insulating layers surround silicon open regions on a test wafer. The facet generated on corners of the rectangle can be analyzed and suppressed by the third mask pattern 23. And, as shown in FIG. 4D, the fourth mask pattern 24 for facet generation evaluation has a pattern in which silicon open regions surround insulating layers, contrary to the third mask pattern 23. The fifth mask pattern 25 for facet generation evaluation shown in FIG. 4E is similar to the fourth mask pattern 24, however, the shape of the silicon corner is different from that of the fourth mask pattern 24, therefore, the fifth mask pattern is applied to analyze facet generation of the pattern.

If the size is different in the same pattern, that is, if the active region is changed in proportion to the surrounding pattern, over-growth may be generated due to loading effect of silicon source. In the present invention, the loading effect can be accurately analyzed by the mask pattern 40 for loading effect evaluation.

The mask pattern 50, for uniformity evaluation, comprises bar patterns and it is applied to evaluate uniformity of growth thickness according to wafer position by scanning the step with Automatic Force Microscope AFM. The step is scanned after wet-dip of the oxide layer in an oxide layer pattern and after SEG growth in a nitride layer pattern.

As described above, according to the present invention, a mask comprises a plurality of mask patterns for technological development of SEG process, thereby reducing time and cost for improvement of the technology. And, according to the present invention, it is also possible to accurately analyze the SEG process, thereby reducing time and cost to develop SEG equipment such as LPCVD and UHV-CVD. Moreover, silicon growth can be measured to a large extent, thereby improving device properties.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A mask for evaluating a selective epitaxial growth process, applied to pattern an insulating layer on wafer divided into 5 areas, comprising:

a mask pattern for resistance measurement to measure sheet resistance of grown single crystal silicon in a first area;

a mask pattern for selectivity evaluation to evaluate selectivity of single crystal silicon growth in a second area diagonal to the first area; mask patterns for facet generation evaluation, having different shapes, to evaluate facet generation of grown single crystal silicon in a third area;

mask patterns for loading effect evaluation, having different shapes, to evaluate growth of single crystal silicon by loading effect in the upper part of a fourth area; and a mask pattern for uniformity evaluation to evaluate uniformity of grown single crystal silicon in the lower part of the pattern for loading effect evaluation in the fourth area.

2. The mask of claim 1, wherein the mask is in a regular square form, and one side of the square is approximately 15,000 to 30,000 $\mu$m.

3. The mask of claim 1, wherein the mask pattern for resistance measurement has a block shape.

4. The mask of claim 3, wherein the square block is approximately 5,000 about 8,000 $\mu$m times 5,000 about 8,000 $\mu$m.

5. The mask of claim 1, wherein the mask for selectivity evaluation comprises a plurality of concentric circular bands, with an outside band having a larger inside diameter than an inside band.

6. The mask of claim 5, wherein inside diameters of the circular bands are doubled concentrically outward toward the outside band.

7. The mask of claim 5, wherein an innermost circular band has an inside diameter of approximately 4 to 10 μm.

8. The mask of claim 5, wherein an outermost circular band has the inside diameter 10,000 μm or less.

9. The mask of claim 5, wherein a width of a circular band corresponds to a distance between the circular bands just inside it.

10. The mask of claim 5, wherein the circular bands have consecutive numbers on the upper parts thereof.

11. The mask of claim 1, wherein the mask pattern for facet generation evaluation comprises a first through a fifth mask pattern having different shapes.

12. The mask of claim 11, wherein the first mask pattern for facet generation evaluation comprises a plurality of bar patterns rotated at a predetermined angle.

13. The mask of claim 12, wherein a width of the bar pattern is approximately 0.5 to 10 μm and a length of the bar pattern is approximately 1,500 to 3,000 μm.

14. The mask of claim 12, wherein the first mask pattern for facet generation evaluation comprises 5 bar patterns of with a ratio of approximately 10 μm: 5 μm: 2 μm: 1 μm: and 0.5 μm wide.

15. The mask of claim 12, wherein the rotation angle of the bar patterns is 15°.

16. The mask of claim 11, wherein the second mask pattern for facet generation evaluation comprises two patterns perpendicular to each other, wherein each pattern has a square-semicircular pattern comprising a square pattern and semicircular pattern disposed on opposite sides of the square pattern.

17. The mask of claim 16, wherein a long side of the square-semicircular pattern is twice as long as a short side thereof.

18. The mask of claim 16, wherein one side of the square semicircular pattern is approximately 0.5 to 10 μm long.

19. The mask of claim 11, wherein the second mask pattern for facet generation evaluation comprises 5 kinds of patterns and one side of each pattern is approximately 10 μm, 5 μm, 2 μm, 1 μm, and 0.5 μm long.

20. The mask of claim 11, wherein the third mask pattern for facet generation evaluation has a pattern in which inner square patterns to be etched are surrounded by outer square patterns not to be etched.

21. The mask of claim 20, wherein one side of the inner square pattern is 80 μm long.

22. The of claim 20, wherein the third mask pattern comprises 5 kinds of patterns and a side of each inner square pattern is approximately 8 μm, 4 μm, 1.6 μm, 0.8 μm and 0.4 μm long and a side of each outer square pattern is approximately 10 μm, 5 μm, 2 μm, 1 μm and 0.5 μm long.

23. The mask of claim 11, wherein the fourth mask pattern for facet generation evaluation has a pattern in which outer square patterns to be etched surround inner square patterns not to be etched.

24. The mask of claim 23, wherein one side of the outer square pattern is 120 μm long.

25. The mask of claim 23, wherein the fourth mask pattern comprises 5 kinds of patterns and one side of each inner square pattern is approximately 10 μm, 5 μm, 2 μm, 1 μm and 0.5 μm long and one side of each outer square pattern is approximately 12 μm, 6 μm, 2.4 μm, 1.2 μm and 0.6 μm long.

26. The mask of claim 11, wherein the fifth mask pattern for facet generation evaluation has a pattern in which a diamond is disposed in a square.

27. The mask of claim 26, wherein a side of the diamond is 80 μm long.

28. The mask of claim 27, wherein a side of the square is approximately 0.5 to 10 μm long.

29. The mask of claim 28, wherein the fifth mask pattern for facet generation evaluation comprises 5 kinds of square patterns and a side of each square pattern is approximately 8 μm, 4 μm, 1.6 μm, 0.8 μm and 0.4 μm long.

30. The mask of claim 1, wherein the mask patterns for loading effect evaluation comprises a first and a second mask patterns having different shapes.

31. The mask of claim 30, wherein the first mask pattern for loading effect evaluation comprises a plurality of circle patterns arranged within the same distance and having increasingly smaller diameters in one direction.

32. The mask of claim 31, wherein the circle patterns are doubled in diameter from approximately 0.25 μm o 1,500 μm.

33. The mask of claim 31, wherein the distance between circle patterns is approximately 50 to 150 μm.

34. The mask of claim 31, wherein a first mask pattern for loading effect evaluation comprises circle patterns having diameters of approximately 16 μm, 8 μm, 4 μm, 2 μm, 1 μm, 0.5 μm and 0.2 μm.

35. The mask of claim 34, wherein the first mask pattern for loading effect evaluation comprises at least 2 groups of the circle patterns.

36. The mask of claim 30, wherein the second mask pattern for loading effect evaluation comprises a plurality of bars arranged with the same distance between them and having smaller widths in one direction.

37. The mask of claim 36, wherein the widths of the bars is doubled from approximately 0.25 μm to 1,500 μm.

38. The mask of claim 36, wherein the bars have a length of approximately 1,000 to 2,000 μm.

39. The mask of claim 36, wherein the distance between bar patterns is approximately 50 to 150 μm.

40. The mask of claim 36, wherein the second mask for loading effect evaluation comprises bars having widths of approximately 16 μm, 8 μm, 4 μm, 2 μm, 1 μm, 0.5 μm and 0.2 μm.

41. The mask of claim 40, wherein the second mask for loading effect evaluation comprises at least 2 groups bars.

42. The mask of claim 1, wherein the mask pattern for uniformity evaluation comprises a plurality of bars arranged at a regular distance, having the same length and width.

43. The mask of claim 42, wherein the bars have a width of approximately 0.2 to 0.5 μm and a length of approximately 4,000 to 8,000 μm.

44. The mask of claim 42, wherein the regular distance between the bars is approximately 0.2 to 0.5 μm.

45. The mask of claim 42, wherein the whole width of the mask pattern for uniformity evaluation is approximately 6,000 to 10,000 μm.

* * * * *